United States Patent
Gramegna et al.

(10) Patent No.: US 6,392,490 B1
(45) Date of Patent: May 21, 2002

(54) HIGH-PRECISION BIASING CIRCUIT FOR A CASCODED CMOS STAGE, PARTICULARLY FOR LOW NOISE AMPLIFIERS

(75) Inventors: Giuseppe Gramegna, Catania; Alessandro D'Aquila, Palermo; B. Marco Marletta, Catania, all of (IT)

(73) Assignee: STMicroeletronics S.R.L., Agrate Brianza (IT)

( * ) Notice: Subject to any disclaimer, the term of this patent is extended or adjusted under 35 U.S.C. 154(b) by 30 days.

(21) Appl. No.: 09/650,022

(22) Filed: Aug. 28, 2000

(30) Foreign Application Priority Data

Aug. 31, 1999 (EP) .............................................. 99830542

(51) Int. Cl.$^7$ ................................................. H03F 1/22
(52) U.S. Cl. ........................ 330/296; 330/283; 330/311
(58) Field of Search ................................ 330/283, 296, 330/311

(56) References Cited

U.S. PATENT DOCUMENTS

| | | | |
|---|---|---|---|
| 4,260,956 A | * | 4/1981 | Harford .................. 330/283 X |
| 4,528,520 A | | 7/1985 | Osawa ........................ 330/300 |
| 5,563,553 A | | 10/1996 | Jackson ........................ 331/57 |
| 5,717,360 A | | 2/1998 | Vu et al. ..................... 330/253 |
| 5,748,040 A | | 5/1998 | Leung ......................... 330/253 |
| 5,838,191 A | | 11/1998 | Opris et al. .................. 327/539 |
| 6,271,695 B1 | * | 8/2001 | Gramegna et al. ....... 330/283 X |

* cited by examiner

Primary Examiner—Steven J. Mottola
(74) Attorney, Agent, or Firm—Lisa K. Jorgenson; Allen, Dyer, Doppelt, Milbrath & Gilchrist, P.A.

(57) ABSTRACT

A high-precision biasing circuit is provided for a CMOS cascode stage with inductive load and degeneration. The cascode stage includes at least two MOS transistors serially connected between a first voltage reference and a second voltage reference. The biasing circuit includes at least a first MOS replica transistor and a second MOS replica transistor, and two current generators for biasing the first and second MOS replica transistors. A circuit block detects a voltage value on a terminal of the second replica MOS transistor and applies a voltage to a gate terminal of the first replica transistor. Two circuit block implementations include a voltage amplifier and a folded cascode amplifier closed in a shunt feedback. Both implementations allow the threshold voltages of the cascode stage transistors to be tracked, as well as their Early and body effects.

27 Claims, 3 Drawing Sheets

HIGH-PRECISION BIASING CIRCUIT FOR A CASCODED CMOS STAGE, PARTICULARLY FOR LOW NOISE AMPLIFIERS

FIELD OF THE INVENTION

The present invention relates to biasing circuits, and, more particularly, to a high-precision biasing circuit for a CMOS cascode stage with inductive load and degeneration.

The cascode stage includes at least two MOS transistors serially connected between a first voltage reference and a second voltage reference. The present invention has been developed for a low noise amplifier (LNA) having a very large linearity, high gain and ultra low noise (~Pin=−4 dBm, Gain=14 dB, 50 W input/output matching and a noise figure <1.5 dB).

BACKGROUND OF THE INVENTION

On-chip integration of inductors, in CMOS technology is making feasible complete transceivers into a single chip. Moreover, cascode stages with inductive load and degeneration have been recently integrated in low noise amplifiers (LNA) and mixers.

FIG. 1a is a schematic example of a single ended LNA, and FIG. 1b is a schematic example of a differential LNA. The amplifier in FIG. 1 includes a CMOS cascode final stage comprising a first input MOS transistor M1 and a second common gate MOS transistor M2. There is a competitive advantage in using CMOS technology with inductive and noiseless degeneration since the linearity is improved while the inductive load allows the output node to swing over the supply voltage, ensuring a large dynamic range.

FIG. 2a is a schematic example of an application where two transistors are in a cascode configuration to achieve a single ended mixer. FIG. 2b is an example of a double cascode transistor configuration to achieve a differential mixer.

Wide dynamic range, large linearity and good noise performance can be achieved at the expense of high current levels. Additionally, the channel length L of the MOS transistor must be kept minimum and the width W must be kept at small to medium values.

The resulting high current density forced through minimum length transistors make them extremely sensitive to what is known as the Early effect. As the load and the degeneration are inductive, the voltage drop Vds(MI) between the drain and source terminals of the first MOS transistor M1 plus the voltage drop Vds(M2) between the drain and source terminals of the second MOS transistor M2 is equal to the supply voltage Vdd.

To ensure a proper control on gain, noise figure and input impedance, the cascode stage must be biased to take into account the Early effect. Therefore, the CMOS stage must include a noiseless, high precision biasing circuit. This is particularly critical because of the following reasons. The first input transistor M1 and the second transistor M2 receive all the DC supply voltage via the gate of the second transistor. Both transistors M1 and M2 are also heavily affected by the Early effect. The circuit performances, i.e., voltage gain, input impedance and noise figure, depend heavily upon the biasing current.

The problem of biasing such LNA circuits can be generalized to the problem of biasing a CMOS cascode stage comprising two transistors connected in series and receiving the full DC supply voltage. The gate of the second transistor M2 is connected to the supply voltage reference Vdd or to a DC potential according to a particular application.

A variety of biasing circuits have been proposed by the known art for solid state amplifiers. Many of these known biasing circuits may be adopted to bias the selective LNA. A commonly used biasing circuit is shown in FIG. 3a and is a circuit derived by a classic cascode current mirror. The resistance Rps represents a DC resistance associated to a non-ideal inductor Ls.

This approach has a drawback due to the fact that the threshold voltage of the transistors M1 and M2 is tracked, while the Early effect of the same transistors M1 and M2 plus the body effect just of transistor M2 is not tracked. Others prior art approaches fail for the same reason. The interposition of a current generator connected in series with the transistors M1b and M2b may compensate the Early effect of one of the transistors M1 or M2, but not both, since Vds(M1b)+Vds(M2b)<Vds(M1)+Vds(M2)=Vdd.

SUMMARY OF THE INVENTION

In view of the foregoing background, it is therefore an object of the present invention to provide a high-precision biasing circuit for a cascode CMOS stage, particularly for low noise amplifiers.

Another object of the present invention is to provide a biasing circuit that does not have internal sensing points.

Yet another object of the present invention is to provide a biasing circuit for a cascode CMOS final output stage driving an inductive load with a proper control gain and noise figure.

Another object of the present invention is to provide the desired biasing conditions for a low noise audio amplifier for wireless communications.

These and other objects, features and advantages in accordance with the present invention are provided based upon a "split biasing technique," i.e., the task of biasing the cascode stage is split into sub-tasks.

The bias circuit comprises two replicas of the transistors M1 and M2 included in the cascode stage, and the desired biasing conditions are forced to one of the replica transistors. Electrical information relevant for the biasing conditions are read from the replica transistor and the desired bias conditions are forced to the other replica transistor using the electrical information previously read.

Another aspect of the present invention relates to a method for biasing a CMOS cascode stage for a low noise amplifier.

BRIEF DESCRIPTION OF THE DRAWINGS

The features and advantages of the biasing circuit and the method according to the present invention will become clear from the following description of a preferred embodiment given as a non-limiting example with reference to the attached drawings.

DETAILED DESCRIPTION OF THE PREFERRED EMBODIMENTS

Figure 1A:
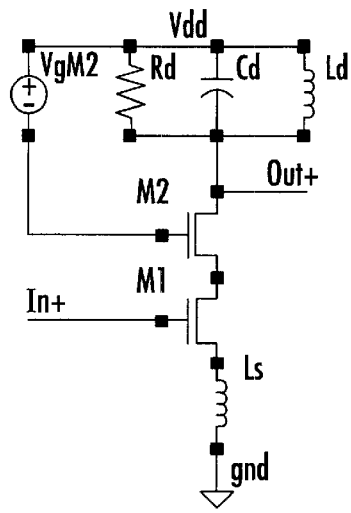
FIG. 1a is a schematic diagram of a single ended low noise amplifier according to the prior art.
Figure 1B:
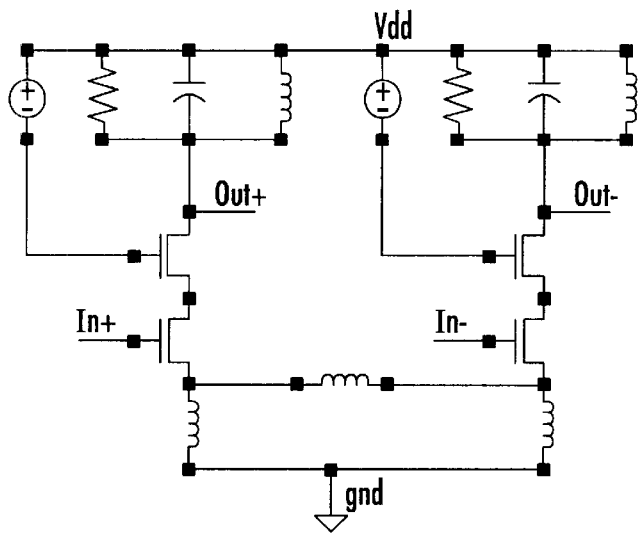
FIG. 1b is a schematic diagram of a differential low noise amplifier according to the prior art.
Figure 2A:
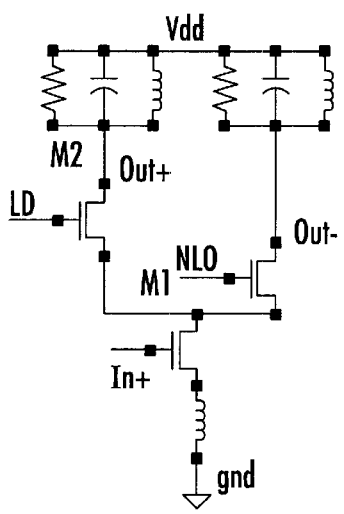
FIG. 2a is a schematic diagram of a single ended mixer according to the prior art.
Figure 2B:
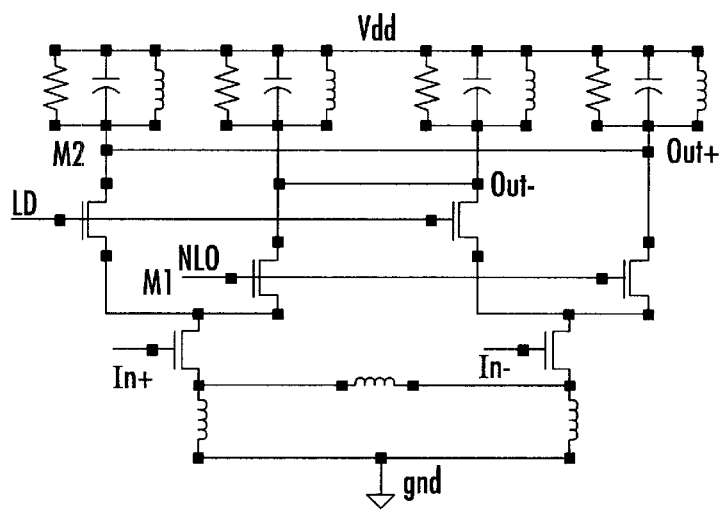
FIG. 2b is a schematic diagram of a differential mixer according to the prior art.
Figure 3:
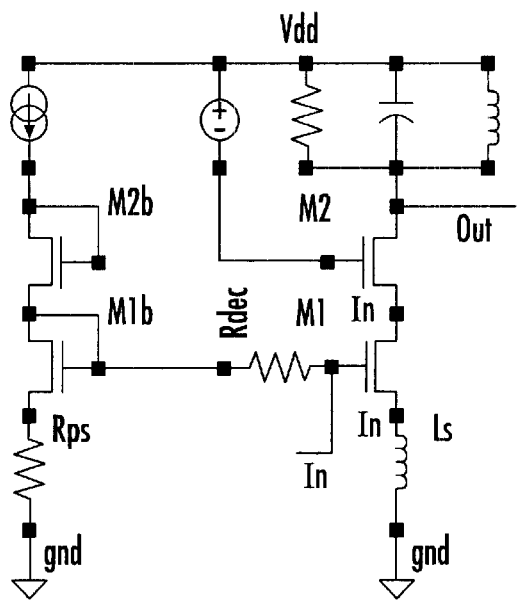
FIG. 3 is a schematic diagram of a cascode current mirror circuit for biasing a CMOS cascode stage according to the prior art.
Figure 4:
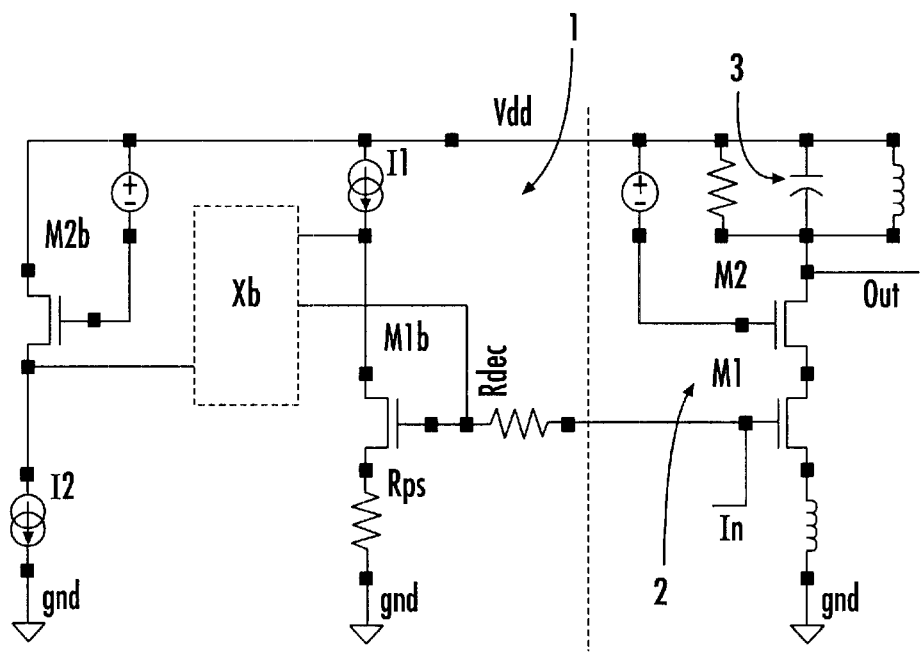
FIG. 4 is a schematic diagram of a biasing circuit according to the present invention.
Figure 5:
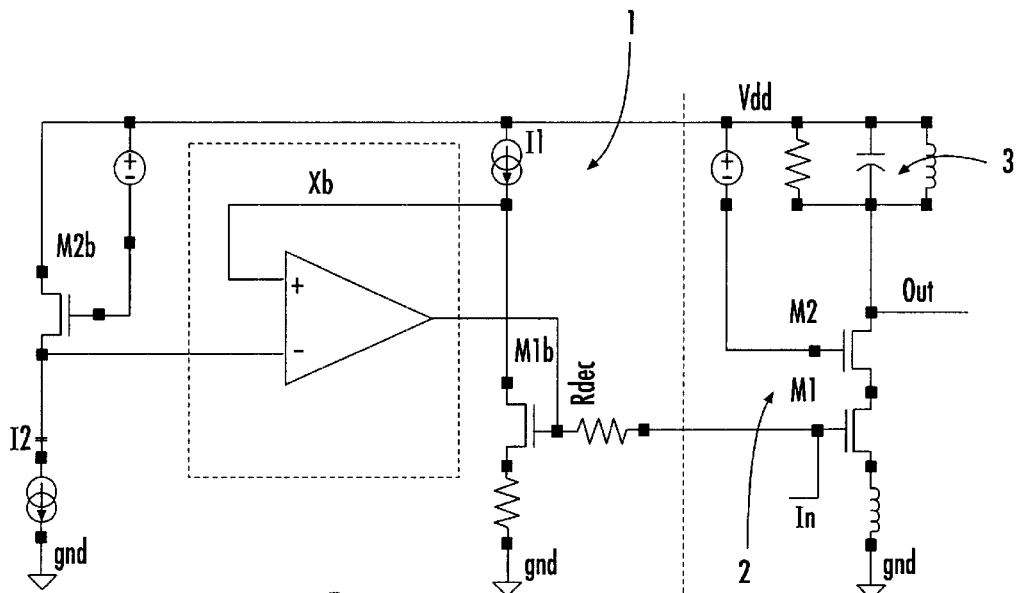
FIG. 5 is a schematic diagram of a first embodiment of the biasing circuit of FIG. 4.
Figure 6:
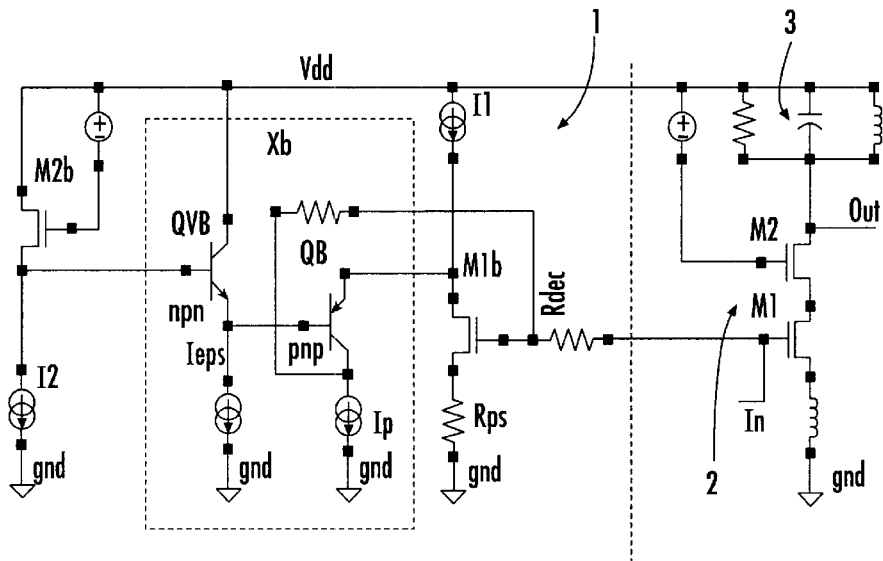
FIG. 6 is a schematic diagram of a second embodiment of the biasing circuit of FIG. 4.

Referring to FIGS. 4–6, reference 1 is a high-precision biasing circuit according to the present invention for a CMOS cascode stage 2 with inductive load and degeneration. The biasing circuit 1 may be associated to a transistor stage including at least two transistors. The following description is a non-limiting example for implementation of a CMOS cascode stage for an audio low noise amplifier for wireless communications. The audio low noise amplifier is a conventional type.

The cascode stage 2 includes a first input MOS transistor M1 connected in series to a second common gate MOS transistor M2. The transistors M1, M2 are serially connected between a first supply voltage reference Vdd and a second voltage reference GND. The gate of the first transistor M1 receives an input signal In. The gate of the second transistor M2 is coupled to the first voltage reference Vdd via a voltage generator. An RLC circuit portion 3 is interposed between the first voltage reference Vdd and the drain terminal of the second transistor M2. An inductive load L is connected between the source terminal of the first transistor M1 and the second voltage reference GND.

According to the present invention, the biasing circuit 1 includes a first replica transistor M1b that is matched to the first input transistor M1 of the stage 2. This first replica transistor M1b is coupled to the first voltage reference Vdd via a current generator I1 and to the second voltage reference GND through a resistor Rps. The gate of the replica transistor M1b is connected to the gate of the first input transistor M1 through a resistor Rdec.

The biasing circuit 1 also includes a second replica transistor M2b connected to the first voltage reference Vdd and to the second voltage reference GND through a current generator I2. The gate of the second replica transistor M2b is coupled to the first voltage reference Vdd through a voltage generator.

Advantageously, according to the present invention, a further circuit component, or block Xb, is provided to connect the first and the second replica transistors M1b and M2b together. More specifically, the component Xb includes a circuit for detecting the voltage value on a terminal, for instance, the source terminal of the second replica transistor M2b, and to force a voltage value on the gate terminal of the first replica transistor M1b. A further input of the circuit block Xb is connected to a conduction terminal, for instance, the drain terminal of the first replica transistor M1b.

The biasing method according to the present invention will now be discussed in greater detail. Desired bias conditions are forced to the second replica transistor M2b. These desired bias conditions are forced to M2b by the current generator I2. Electrical information such as in the form of a signal, which is relevant for the biasing conditions of the first replica transistor M1b, is detected. For instance, the voltage drop Vs(M2b) on the source terminal of the second replica transistor M2b is read and processed by the circuit block Xb.

Then, a desired bias condition is forced to the first replica transistor M1b using the electrical information or signal previously detected. More specifically, the current generator I1 forces a basic bias condition on the first replica transistor M1b and a further driving signal is applied by the circuit block Xb to the gate terminal of the first replica transistor M1b. The voltage value applied to such a gate terminal depends on the voltage value Vs(M2b) on the source terminal of the second replica transistor M2b.

A competitive advantage compared to conventional bias techniques is that the biasing circuit 1 does not affect the performances of the whole circuit structure since there are no sensing points inside the biasing circuit. The biasing circuit 1 according to the present invention may also be applied to other type circuits that includes a plurality of transistors.

The biasing technique according to the present invention provides a split biasing technique since the current generators I2, I1 and the circuit block Xb apply the desired bias conditions. A first preferred embodiment of the circuit block Xb is shown schematically in FIG. 5.

The circuit block Xb may be implemented by a voltage amplifier. The current generators I2 and I1 force the desired bias current to the respective replica transistors M2b and M1b. The amplifier block Xb reads out the voltage value Vs(M2b) on the second replica transistor source terminal and forces to the gate of the first replica transistor M1b the proper gate voltage Vg(M1b) which takes also into account the imposed drain voltage Vd(M1b) and the bias current I1.

Since a possible lack of precision of this first circuit embodiment may be due to the finite open loop gain of the voltage amplifier, a second alternative embodiment is disclosed with reference to FIG. 6. In this second embodiment, which has a specific advantage of saving current, the circuit block Xb is implemented by a portion of a folded cascode amplifier closed in a shunt feedback.

More particularly, a bipolar transistor QVB is connected to the first voltage reference Vdd and is coupled to the second voltage reference GND through a current generator Ieps. The driving/base terminal of this bipolar transistor QVB is directly connected to the source terminal of the second replica transistor M2b. A further bipolar transistor QB is Serially connected to a current generator Ip between the drain terminal of the first replica transistor and the second voltage reference GND.

The base of this further transistor QB is connected to the emitter of the first bipolar transistor QVB while the collector terminal is coupled to the gate terminal of the first replica transistor M1b via a resistor. The first bipolar transistor QVB detects the voltage value Vs(M2b) on the source terminal of the second replica transistor M2b and uses this value to force biasing of the first replica transistor M1b.

More precisely, if the bipolar transistors QB and QVB experience the same current densities, the result is that Vd(M1b)=Vs(M2b). For purposes of discussion with respect to the circuit depicted in FIG. 6, the current values and the transistors areas are equal. Moreover, circuit block Xb, first replica transistor M1b, current generator I1, and resistor Rps represent a folded cascode voltage amplifier closed in shunt-feedback. The bipolar transistor QVB and the current generator Ieps represent a voltage buffer.

In particular, the first bipolar transistor QVB functions at the same time as a voltage translator and as a common base of the folded cascode amplifier. The first replica transistor M1b auto-biases to a proper gate voltage, which takes into account the imposed voltage value Vd(M1b) and the bias current I1. The achieved gate voltage Vg(M1b) is forced to the gate of the first input transistor M1. Thus, the first replica transistor M1b has at its terminals the same voltage values as that of the first input transistor M1.

The aspect ratios of M1b and M2b are related to the aspect ratio of the transistors M1 and M2 of the cascode stage 2. The aspect ratio is defined by the following relation: (W/L)1,2=k*(W/L)b1,b2. The result is that the second replica transistor M2b and the first replica transistor M1b have exactly the same bias conditions at that of transistor M2 and M1 of the stage 2 (Early and body effects included). Therefore, a LNA including such a CMOS stage 2 would be biased to a DC current Ids=k*Idbias, which is not sensitive to a threshold variation and to Early and body effects of the CMOS stage transistors M1 and M2.

The current value Idbias is obtained from a ratio Vbandgap/Rbias, where Rbias is a temperature-compensated resistance and Vbandgap is a temperature stable voltage generated by a bandgap regulator. The circuit and method according to the present invention provides a high-precision biasing circuit: with minimum noise and tracks the Early effect of a CMOS cascode stage.

That which is claimed is:

1. A biasing circuit for a CMOS cascode stage with inductive load and degeneration, the cascode stage comprising at least one first MOS transistor and at least one second MOS transistor serially connected between a first voltage reference and a second voltage reference, the biasing circuit comprising:
   at least one first MOS replica transistor matched to the at least one first MOS transistor and connected thereto, the at least one first MOS replica transistor comprising a gate, source and drain;
   at least one second MOS replica transistor matched to the at least one second MOS transistor and connected to the first voltage reference, the at least one second MOS replica transistor comprising a gate, source and drain;
   a respective current generator for biasing each of said at least one first and second MOS replica transistors; and
   a detection circuit for detecting a voltage on the source of said at least one second MOS replica transistor and for applying a voltage to the gate of said at least one first replica MOS transistor.

2. A biasing circuit according to claim 1, wherein said detection circuit includes an input connected to the drain of said at least one first MOS replica transistor.

3. A biasing circuit according to claim 1, wherein said detection circuit comprises a voltage amplifier having a first input connected to the source of said at least one second MOS replica transistor, a second input connected to the drain of said at least one first MOS replica transistor, and an output connected to the gate of said at least one first MOS replica transistor.

4. A biasing circuit according to claim 1, wherein said detection circuit comprises a folded cascode voltage amplifier closed in a shunt feedback with said at least one first MOS replica transistor and being biased by one of said current generators.

5. A biasing circuit according to claim 4, wherein said folded cascode voltage amplifier comprises a plurality of bipolar transistors connected together.

6. A biasing circuit according to claim 1, wherein each of said at least one first and second MOS replica transistors has an aspect ratio related to an aspect ratio of a respective one of the at least one first and second MOS transistors of the CMOS cascode stage.

7. A biasing circuit for a cascode stage comprising first and second transistors serially connected between a first voltage reference and a second voltage reference, the biasing circuit comprising:
   a first replica transistor matched to the first transistor and connected thereto, the first replica transistor comprising a control terminal and a conduction terminal;
   a second replica transistor matched to the second transistor and connected to the first voltage reference, the second replica transistor comprising a control terminal and a conduction terminal;
   a first current generator for biasing said first replica transistor;
   a second current generator for biasing said second replica transistor; and
   a detection circuit for detecting a voltage value on the conduction terminal of said second replica transistor and for applying a voltage to the control terminal of said first replica transistor.

8. A biasing circuit according to claim 7, wherein the first and second transistors each comprises a MOS transistor; and wherein said first and second replica transistors each comprises a MOS transistor.

9. A biasing circuit according to claim 7, wherein said detection circuit includes an input connected to the conduction terminal of said first replica transistor.

10. A biasing circuit according to claim 7, wherein said detection circuit comprises a voltage amplifier having a first input connected to the conduction terminal of said second replica transistor, a second input connected to the conduction terminal of said first replica transistor, and an output connected to the control terminal of said first replica transistor.

11. A biasing circuit according to claim 7, wherein said detection circuit comprises a folded cascode voltage amplifier closed in a shunt feedback with said first replica transistor and being biased by said first current generator.

12. A biasing circuit according to claim 11, wherein said folded cascode voltage amplifier comprises a plurality of bipolar transistors connected together.

13. A biasing circuit according to claim 7, wherein each of said first and second replica transistors has an aspect ratio related to an aspect ratio of a respective one of the first and second transistors of the cascode stage.

14. An amplifier comprising:
   a cascode stage comprising first and second transistors serially connected between a first voltage reference and a second voltage reference;
   a biasing circuit connected to said cascode stage and comprising
      a first replica transistor matched to said first transistor and connected thereto, said first replica transistor comprising a control terminal and a conduction terminal,
      a second replica transistor matched to said second transistor and connected to the first voltage reference, said second replica transistor comprising a control terminal and a conduction terminal,
      a first current generator for biasing said first replica transistor,
      a second current generator for biasing said second replica transistor, and
      a detection circuit for detecting a voltage value on the conduction terminal of said second replica transistor and for applying a voltage to the control terminal of said first replica transistor.

15. An amplifier according to claim 14, wherein said first and second transistors each comprises a MOS transistor; and wherein said first and second replica, transistors each comprises a MOS transistor.

16. An amplifier according to claim 14, wherein said detection circuit includes an input connected to the conduction terminal of said first replica transistor.

17. An amplifier according to claim 14, wherein said detection circuit comprises a voltage amplifier having a first input connected to the conduction terminal of said second replica transistor, a second input connected to the conduction terminal of said first replica transistor, and an output connected to the control terminal of said first replica transistor.

18. An amplifier according to claim 14, wherein said detection circuit comprises a folded cascode voltage amplifier closed in a shunt feedback with said first replica transistor and being biased by said first current generator.

19. An amplifier according to claim 18, wherein said folded cascode voltage amplifier comprises a plurality of bipolar transistors connected together.

20. An amplifier according to claim 14, wherein each of said first and second replica transistors has an aspect ratio related to an aspect ratio of a respective one of said first and second transistors.

21. A method for biasing a cascode stage comprising first and second transistors serially connected between a first voltage reference and a second voltage reference, the method comprising:

biasing a first replica transistor matched to the first transistor and connected thereto, the first replica transistor comprising a control terminal and a conduction terminal;

biasing a second replica transistor matched to the second transistor and connected to the first voltage reference, the second replica transistor comprising a control terminal and a conduction terminal;

detecting a signal on the conduction terminal of the second replica transistor; and applying a predetermined bias to the control terminal of the first replica transistor based upon the detected signal.

22. A method according to claim 21, wherein the first and second transistors each comprises a MOS transistor; and wherein the first and second replica transistors each comprises a MOS transistor.

23. A method according to claim 21, wherein the detecting and applying are performed by a detection circuit having an input connected to the conduction terminal of the first replica transistor.

24. A method circuit according to claim 21, wherein the detecting and applying are performed by a detection circuit comprising a voltage amplifier having a first input connected to the conduction terminal of the second replica transistor, a second input connected to the conduction terminal of the first replica transistor, and an output connected to the control terminal of the first replica transistor.

25. A method according to claim 21, wherein the detecting and applying are performed by a detection circuit comprising a folded cascode voltage amplifier closed in a shunt feedback with the first replica transistor; the method further comprising biasing the folded cascode voltage amplifer.

26. A method according to claim 25, wherein the folded cascode voltage amplifier comprises a plurality of bipolar transistors connected together.

27. A method according to claim 21, wherein each of the first and second replica transistors has an aspect ratio related to an aspect ratio of a respective one of the first and second transistors of the cascode stage.

* * * * *